United States Patent
Kaida et al.

(10) Patent No.: US 6,232,698 B1
(45) Date of Patent: May 15, 2001

(54) THICKNESS EXTENSIONAL VIBRATION MODE PIEZOELECTRIC RESONATOR

(75) Inventors: Hiroaki Kaida, Moriyama; Mitsuhiro Yamada, Shiga-ken; Jiro Inoue, Omihachiman, all of (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/089,562

(22) Filed: Jun. 3, 1998

(51) Int. Cl.[7] .................................................. H01L 41/08
(52) U.S. Cl. ............................................................ 310/320
(58) Field of Search .......................... 310/320, 357–359, 310/365, 366

(56) References Cited

U.S. PATENT DOCUMENTS

| | | | |
|---|---|---|---|
| 3,699,484 | * 10/1972 | Berlincourt | 310/320 X |
| 4,384,229 | * 5/1983 | Inoue | 310/320 X |
| 4,894,580 | * 1/1990 | Ogawa | 310/320 |
| 4,900,970 | * 2/1990 | Ando | 310/320 |
| 4,918,350 | * 4/1990 | Ando | 310/320 |
| 4,939,403 | * 7/1990 | Kittaka | 310/320 |
| 5,045,744 | * 9/1991 | Ando | 310/320 |
| 5,065,066 | 11/1991 | Nakatani et al. | 310/320 |
| 5,345,136 | * 9/1994 | Takagi | 310/320 |
| 5,808,397 | * 9/1998 | Kotani | 310/320 |

OTHER PUBLICATIONS

Patent Abstracts of Japan vol. 010, No. 272 (E–437), Sep. 16, 1986 & JP 61 094408 A (NEC Corp), May 13, 1986 abstract.

* cited by examiner

Primary Examiner—Mark O. Budd
(74) Attorney, Agent, or Firm—Keating & Bennett, LLP

(57) ABSTRACT

An energy-trap thickness extensional vibration mode piezoelectric resonator uses a harmonic of a thickness extensional vibration mode and effectively suppresses generation of unwanted spurious vibrations. The energy-trap thickness extensional vibration mode piezoelectric resonator includes a piezoelectric strip, first and second excitation electrodes located on opposite surfaces of the piezoelectric strip, and an internal electrode disposed inside the piezoelectric strip. The first and second excitation electrodes are located on opposite ends of the piezoelectric strip in an overlapping arrangement. The internal electrode is located opposite to the first and second excitation electrodes. The first and second excitation electrodes overlap each other over a length of l such that l/d is not greater than about 6, where d=t/n.

19 Claims, 13 Drawing Sheets

▲ TE2-Fr
● TE2-Fa
△ S1-Fr
○ S1-Fa

THICKNESS EXTENSIONAL VIBRATION MODE PIEZOELECTRIC RESONATOR

BACKGROUND OF THE INVENTION

1. Field of the Invention

The present invention relates to an energy trap piezoelectric resonator used in various resonators, oscillators, and similar devices and, more particularly, to an energy trap thickness extensional vibration mode piezoelectric resonator constructed to maximize use of harmonics of a thickness extensional vibration mode.

2. Description of the Related Art

Piezoelectric resonators are used in various piezoelectric resonator components such as piezoelectric oscillators and piezoelectric filters. Known piezoelectric resonators of this kind utilize various piezoelectric vibration modes, depending on the frequency desired.

An energy-trap piezoelectric resonator utilizing the second-order wave of a thickness extensional vibration mode is disclosed in Japanese Unexamined Patent Publication No. 117409/1989. This piezoelectric resonator is now described with reference to FIGS. 17 and 18.

The piezoelectric resonator shown in FIGS. 17 and 18 is constructed by stacking ceramic green sheets 51, 52 made of a piezoelectric material on top of each other and sintering the sheets 51, 52 together, as shown in the exploded perspective view of FIG. 17. A circular excitation electrode 53 is disposed in the center of the ceramic green sheet 51. The excitation electrode 53 is extended to an end of the ceramic green sheet 51 via an extraction electrode 54. A circular excitation electrode 55 is disposed in the center of the top surface of the ceramic green sheet 52. The excitation electrode 55 is extended to an end of the ceramic green sheet 52 via an extraction electrode 56. As shown in the lower projected view of FIG. 17, an excitation electrode 57 is disposed on the bottom surface of the ceramic green sheet 52. The excitation electrode 57 is extended to an end of the ceramic green sheet 52 via an extraction electrode 58. It is noted that the electrodes 53, 55, 57 are only partially formed and only partially cover the respective surfaces of the green sheets 51, 52, respectively at a central portion thereof and do not extend across an entire width or length of the sheets 51, 52. That is, the circular electrodes 53, 55, 57 are surrounded in all directions by the surfaces of the respective green sheets 51, 52.

The ceramic green sheets 51 and 52 are stacked on top of each other and pressure is applied in the direction of thickness thereof. Then, the sheets 51, 52 are sintered, thus producing a sintered body. The sintered body is then polarized. Thus, a piezoelectric resonator 60 is obtained, as shown in FIG. 18.

In the piezoelectric resonator 60, piezoelectric layers 61 and 62 are polarized uniformly in the direction of the arrows, i.e., in the direction of thickness.

When the device shown in FIG. 18 is driven, the excitation electrodes 53 and 57 are connected together, and an AC voltage is applied between the excitation electrodes 53, 57 and the excitation electrode 55. In this way, the piezoelectric resonator 60 is driven to resonate such that the vibration energy is confined to a region where the excitation electrodes 53, 55, 57 overlap each other, i.e., a resonating portion A.

The prior art piezoelectric resonator 60 which is constructed to use the harmonics of a thickness extensional vibration mode is designed as an energy-trap piezoelectric resonator as mentioned above. Therefore, in order to function as an energy trap type resonator, this resonator 60 requires vibration-attenuating portions which are located so as to surround the resonating portion A in all directions for attenuating vibrations created therein. More specifically, because the circular electrodes 53, 55 and 57 are surrounded by surfaces of the respective green sheets 51, 52 at which vibration-attenuating portions are located, the vibration-attenuating portions have a large size compared with the size of the resonating portion. The large size and arrangement of vibration-attenuating portions in all directions around the electrodes 53, 55, 57 and resonating portion A are necessary to sufficiently suppress vibrations. Thus, because large vibration-attenuating portions are required to suppress vibrations, it has been difficult to reduce the size of the piezoelectric resonator 60.

On the other hand, Japanese Unexamined Patent Publication No. 235422/1990 discloses an energy-trap piezoelectric resonator that uses a piezoelectric ceramic strip and hardly needs extra piezoelectric substrate portions surrounding the resonating portion to attenuate vibrations.

In this device shown in FIG. 19, an excitation electrode 72a and an excitation electrode 72b are located on the top and bottom major surfaces, respectively, of an elongated piezoelectric substrate 71. The excitation electrodes 72a and 72b extend along the entire width and part of the length of the piezoelectric substrate 71, and are disposed opposite to each other with the piezoelectric substrate 71 located therebetween. The electrodes 72a, 72b overlap each other at an approximately central portion of the piezoelectric substrate 71 to define a resonating portion. The excitation electrodes 72a and 72b extend to longitudinal ends 71a and 71b, respectively, of the piezoelectric substrate 71.

When the piezoelectric resonator 70 is excited into a thickness extensional vibration mode, unwanted vibrations occur due to the dimensional relation between the width W and the thickness T of the piezoelectric substrate 71. Accordingly, Japanese Unexamined Patent Publication No. 235422/1990 discloses that where the fundamental wave is used, W/T=5.33 should be used if the resonance frequency is 16 MHz, and that where the third-order wave is used, setting W/T to approximately 2.87 (where the resonance frequency is approximately 16 MHz) can reduce unwanted spurious waves between resonant and antiresonant frequencies.

As described above, the energy-trap piezoelectric resonator disclosed in Japanese Unexamined Patent Publication No. 117409/1989 and utilizing the second-order wave of a thickness extensional vibration mode needs large vibration-attenuating portions adjacent to the resonating portion.

Hence, it is difficult to reduce the size of the resonator.

The energy-trap piezoelectric resonator disclosed in Japanese Unexamined Patent Publication No. 235422/1990 does not require vibration-attenuating portions adjacent to the resonator portion and so a reduction in size can be attained. However, because harmonic waves of a thickness extensional vibration mode are utilized in this resonator, various unwanted spurious waves appear, in addition to the spurious waves between the resonant and antiresonant frequencies. Because this resonator does not have extra portions surrounding the resonating portion, the spurious waves are generated and are not suppressed. As a result, effective and sufficient resonant characteristics can not be achieved in this resonator.

SUMMARY OF THE INVENTION

To overcome the problems described above, the preferred embodiments of the present invention provide an energy trap thickness extensional piezoelectric resonator that maximizes the use of harmonic waves of a thickness extensional vibration mode, has a significantly reduced size, suppresses unwanted spurious vibrations and has excellent resonant characteristics.

The preferred embodiments of the present invention provide an energy trap thickness extensional vibration mode piezoelectric resonator utilizing an nth-order harmonic of a thickness extensional vibration mode. The preferred embodiments of the energy trap piezoelectric resonator preferably include a piezoelectric plate having first and second surfaces arranged opposite to each other, a first excitation electrode and a second excitation electrode provided on the first and second surfaces, respectively, and arranged opposite to each other with the piezoelectric plate located therebetween, at least one internal electrode disposed in the piezoelectric plate and at least partially located opposite to the first and second excitation electrodes, the opposing portion of the first and second excitation electrodes, the internal electrode and the piezoelectric plate defining a resonating portion, vibration-attenuating portions disposed on both sides of said resonating portion along only one direction, said first and second excitation electrodes extending to or close to both ends of the piezoelectric plate in a direction that is substantially perpendicular to the one direction along which the vibration-attenuating portions extend; and the first and second excitation electrodes being arranged to overlap each other over a length of l such that l/d is approximately equal to or less than about 6.0 in which d=t/n, where t is a thickness of the piezoelectric plate and n is an integral larger than 1.

With the configuration of the preferred embodiments described above, unwanted spurious vibrations caused by inharmonic overtones and harmonics other than the harmonic used in the resonator can be effectively suppressed. As a result, an energy trap thickness extensional piezoelectric resonator having excellent resonant characteristics is provided.

In the preferred embodiments of the present invention, an energy-trap thickness extensional vibration mode piezoelectric resonator is constructed such that the ratio l/d is preferably in a range of about 3 to about 6.

With the structure of the preferred embodiments of the present invention, spurious components caused by inharmonic overtones are suppressed and an energy-trap thickness extensional vibration mode piezoelectric resonator having a wide bandwidth and significantly improved resonant characteristics is achieved. More preferably, the ratio l/d is preferably within a range of about 4.5 to 5.5 about to maximize the bandwidth.

In the above described energy-trap thickness extensional vibration mode piezoelectric resonator, the piezoelectric plate preferably has an elongated piezoelectric strip shape. With such a structure, miniaturization of the thickness extensional vibration mode piezoelectric resonator is significantly increased.

The energy-trap thickness extensional vibration mode piezoelectric resonator may further include a capacitor disposed on first and second surfaces of the piezoelectric plate with a space defined therebetween to allow for free and unimpeded vibration of the piezoelectric resonator.

With the above-described structure according to preferred embodiments of the present invention, a piezoelectric resonator having a built-in capacitor and using a piezoelectric resonator having no or negligible unwanted spurious vibrations caused by inharmonic overtones can be provided. As a result, the resonator has excellent resonant characteristics.

Other features and advantages of the present invention will become apparent from the following description of the invention which refers to the accompanying drawings.

DETAILED DESCRIPTION OF PREFERRED EMBODIMENTS

Figure 1:
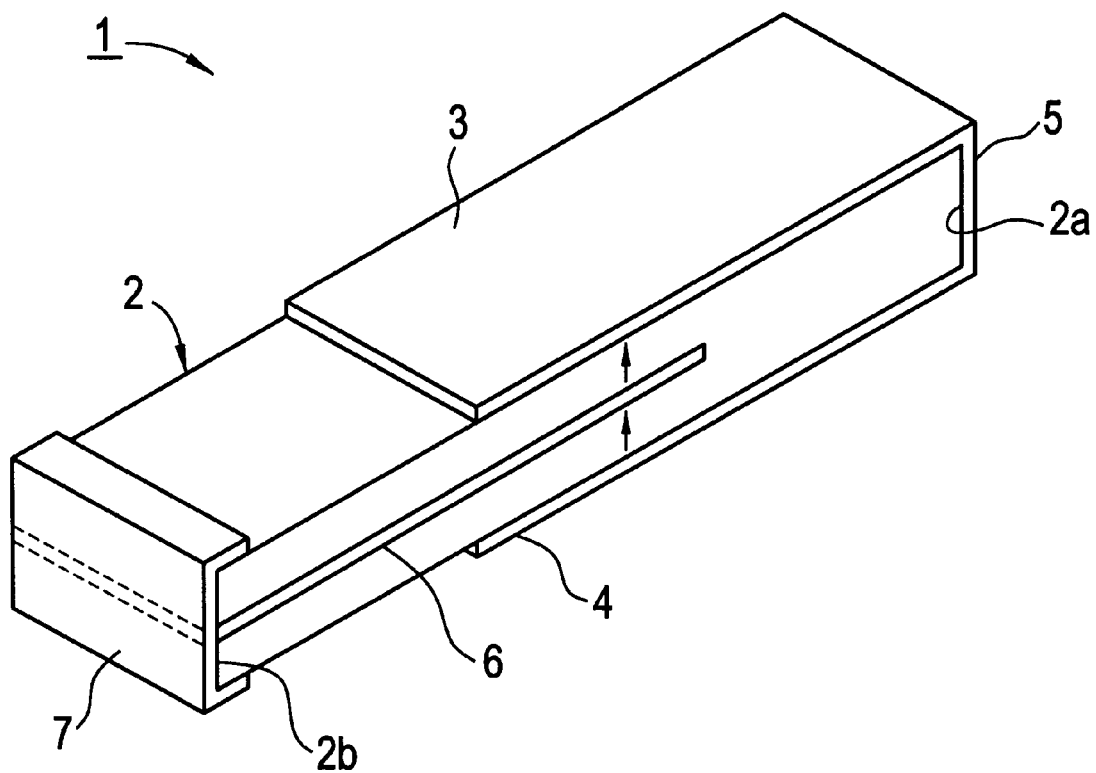
FIG. 1 is a perspective view showing a thickness extensional piezoelectric resonator according to a first preferred embodiment of the invention.
Figure 2:
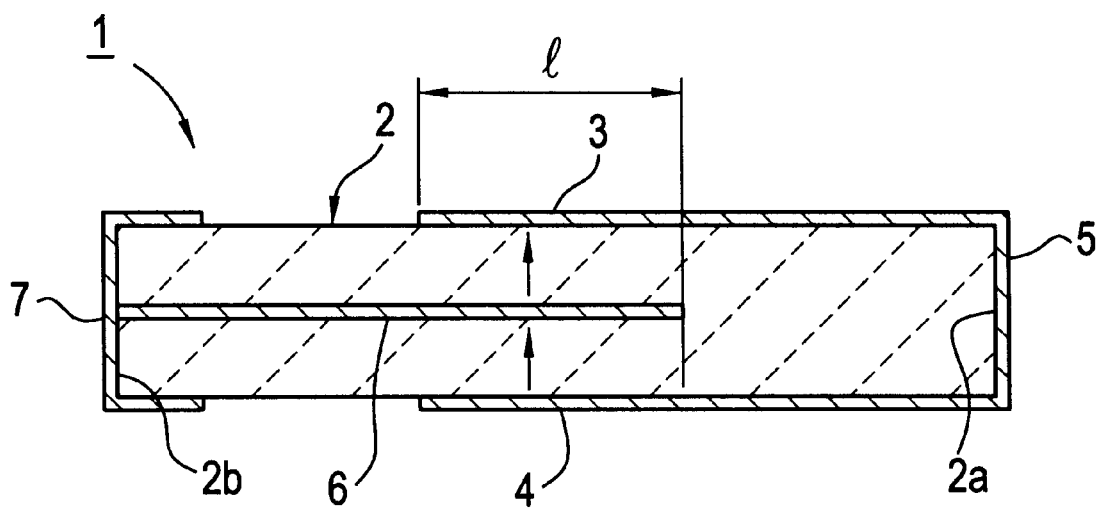
FIG. 2 is a cross-sectional view of the thickness extensional piezoelectric resonator according to the first preferred embodiment.
Figure 3:
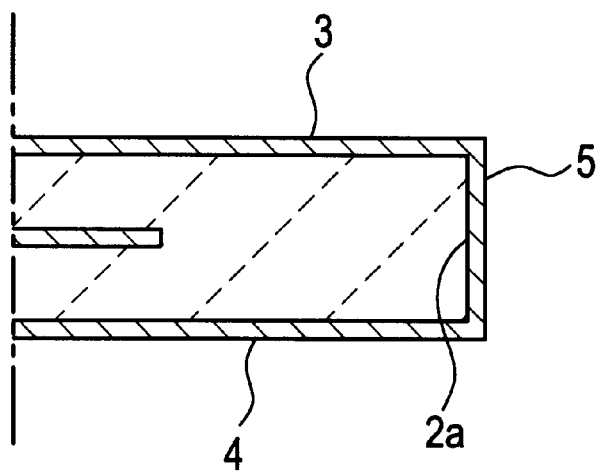
FIG. 3 is a cross sectional view of a portion of the piezoelectric resonator corresponding to portions having displacement distributions shown in FIGS. 4 and 5.

FIG. 1 is a perspective view showing a thickness extensional vibration mode piezoelectric resonator 1 according to a first preferred embodiment of the invention. FIG. 2 is a cross-sectional view of the resonator 1.

The thickness extensional piezoelectric resonator 1 preferably includes an elongated piezoelectric strip 2 made of a piezoelectric ceramic such as a lead zirconate titanate-based ceramic.

The piezoelectric strip 2 is preferably polarized uniformly in the direction of thickness as indicated by the arrows in FIG. 1. A first excitation electrode 3 is disposed on the top surface of the piezoelectric strip 2. A second excitation electrode 4 is disposed on the bottom surface of the piezoelectric strip 2. Excitation electrodes 3 and 4 extend from one end surface 2a of the piezoelectric strip 2 to the other end surface 2b at the top and bottom surfaces of the piezoelectric strip 2.

The excitation electrodes 3 and 4 are connected together by a connecting electrode 5 located at the end surface 2a of the piezoelectric strip 2.

An internal electrode 6 is located at a middle portion within the piezoelectric strip 2. The internal electrode 6 is extended to the end surface 2b of the piezoelectric strip 2, and is electrically connected with a terminal electrode 7 located on the end surface 2b.

During operation, an AC voltage is applied between the first and second excitation electrodes 3, 4 and the internal electrode 6, thus inducing the second-order wave of the thickness extensional vibration mode strongly. In this way, the resonator 1 can be used as a piezoelectric resonator utilizing the second-order wave.

The first and second excitation electrodes 3 and 4 are stacked over the internal electrode 6 via the piezoelectric layer at the approximate central portion of the piezoelectric strip 2. Therefore, in the portion where the internal electrode 6 overlaps the first and second excitation electrodes 3, 4, an energy-trap resonating portion is defined. When this resonating portion is resonating, the energy is attenuated by the piezoelectric portions extending from the resonating portion to the end surfaces 2a and 2b.

If the above-described resonating portion is viewed as the approximately central portion, vibration-attenuating portions are defined at longitudinally opposite sides only in the longitudinal direction of the piezoelectric strip 2. The first and second excitation electrodes extend to the sides of the piezoelectric strip in a direction that is substantially perpendicular to the longitudinal direction, i.e., substantially perpendicular to the longitudinal ends.

In this case, the first and second excitation electrodes 3, 4 and the internal electrode 6 are required to extend along the entire width of the piezoelectric strip 2 only at the resonating portion 6. Outside of the resonating portion, the width of each of the excitation electrodes is not always required to be maintained. For example, the excitation electrode 3 needs to extend along the entire width of the piezoelectric strip 2 only at the resonating portion. The portion of the excitation electrode 3 on the side of the end surface 2a may be thinner because this portion of the electrode 3 simply electrically connects the excitation electrode 3 with the connecting electrode 5.

The present preferred embodiment preferably is constructed such that a ratio l/d is not greater than about 6, where l is the length of overlap between the internal electrode 6 with the excitation electrodes 3 and 4 in a first direction, or the longitudinal direction of the piezoelectric plate 2 that connects the vibration-attenuating portions on both sides of the resonating portion, t is the thickness of the piezoelectric plate 2, and d=t/n. In particular, in the energy-trap thickness extensional vibration mode piezoelectric resonator 1, the ratio l/d is preferably not greater than about 6. As a result, the resonator effectively suppresses unwanted spurious components, unlike the prior art strip-type thickness extensional vibration mode piezoelectric resonator. This will be described with reference to FIG. 20 and FIGS. 3–9.

Figure 19:
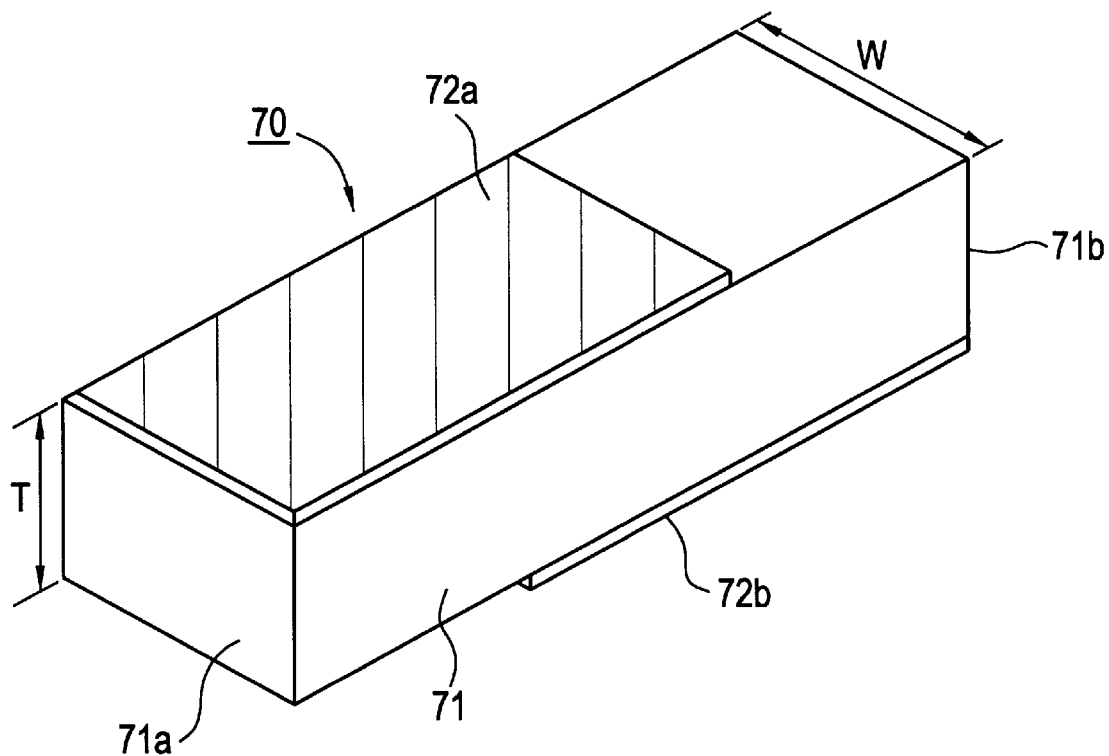
FIG. 19 is a perspective view illustrating another example of a prior art thickness extensional piezoelectric resonator.
Figure 20:
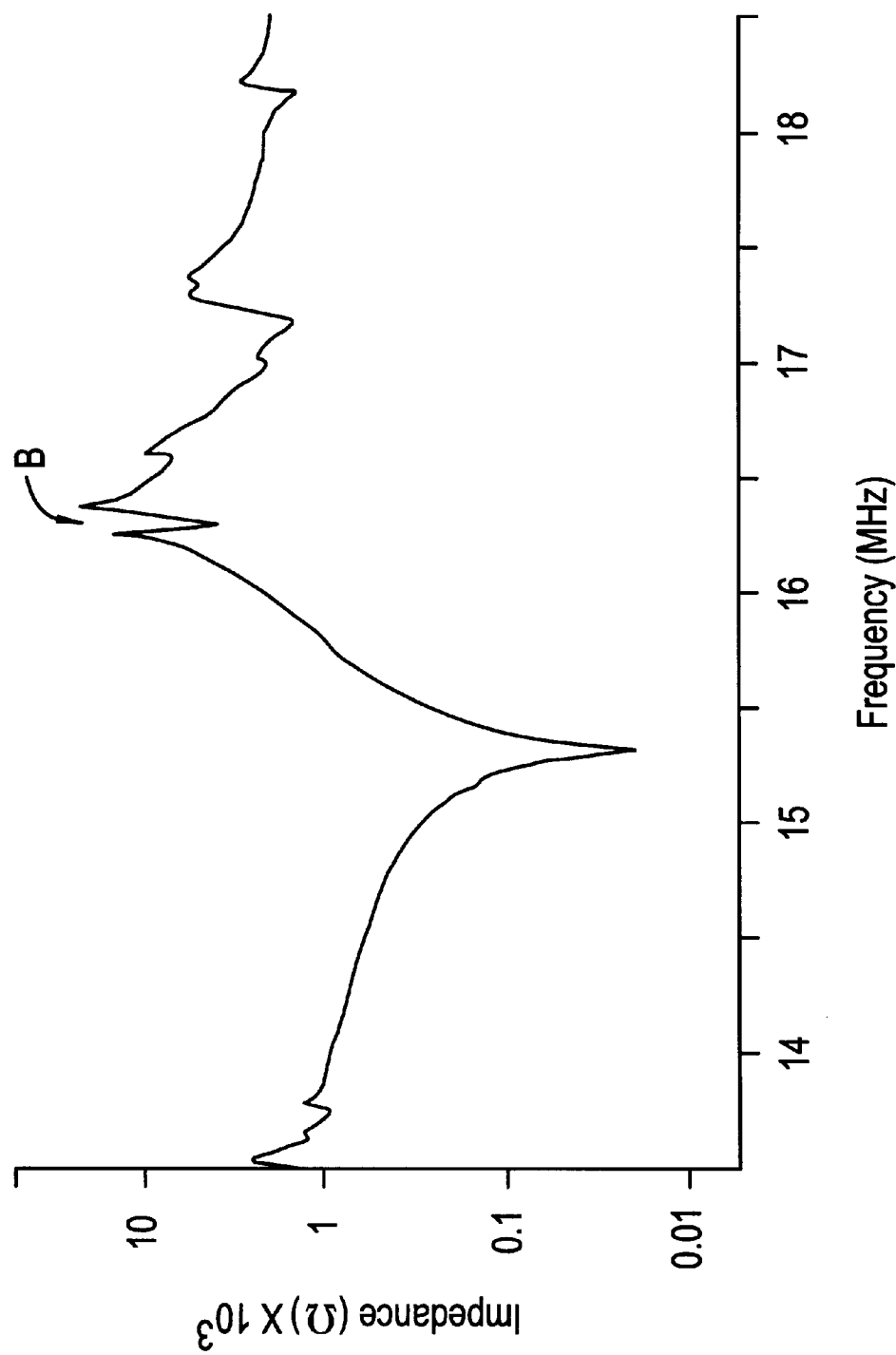
FIG. 20 is a diagram illustrating the impedance-frequency characteristic of the prior art thickness extensional piezoelectric resonator.

The impedance-frequency of the prior art strip-type piezoelectric resonator 70 shown in FIG. 19 is depicted in FIG. 20. As can be seen from FIG. 20, it can be observed that in response to the second-order wave of a thickness extensional vibration mode, waveform division takes place near the antiresonant point as indicated by the arrow B in FIG. 20. Thus, the resonant characteristic in the band between the resonant and the antiresonant frequencies is deteriorated.

To solve this problem, the inventors of the present invention studied the cause of the waveform division indicated by the arrow B and discovered that the waveform division is caused by spurious vibrations known as inharmonic overtones. Also, the inventors discovered that the effects of the inharmonic overtones can be effectively suppressed by adjusting the aforementioned ratio l/d.

Figure 4:
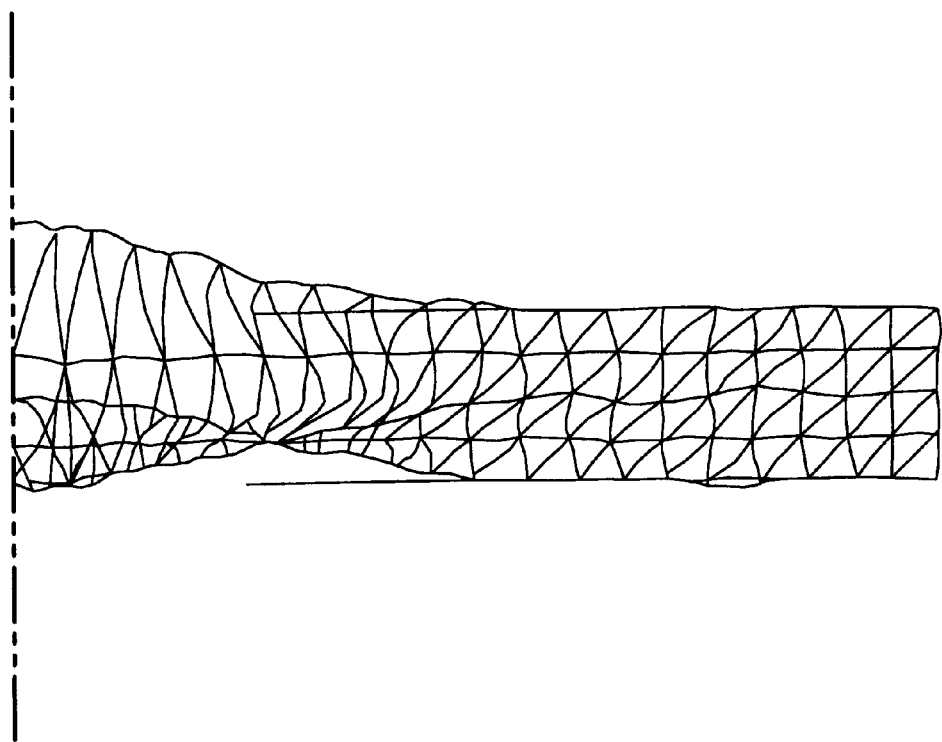
FIG. 4 is a diagram illustrating the distribution of displacements of a piezoelectric body vibrating in a second-order wave ($TE_2$) of a thickness extensional vibration mode, the distribution being analyzed by the finite element method.
Figure 5:
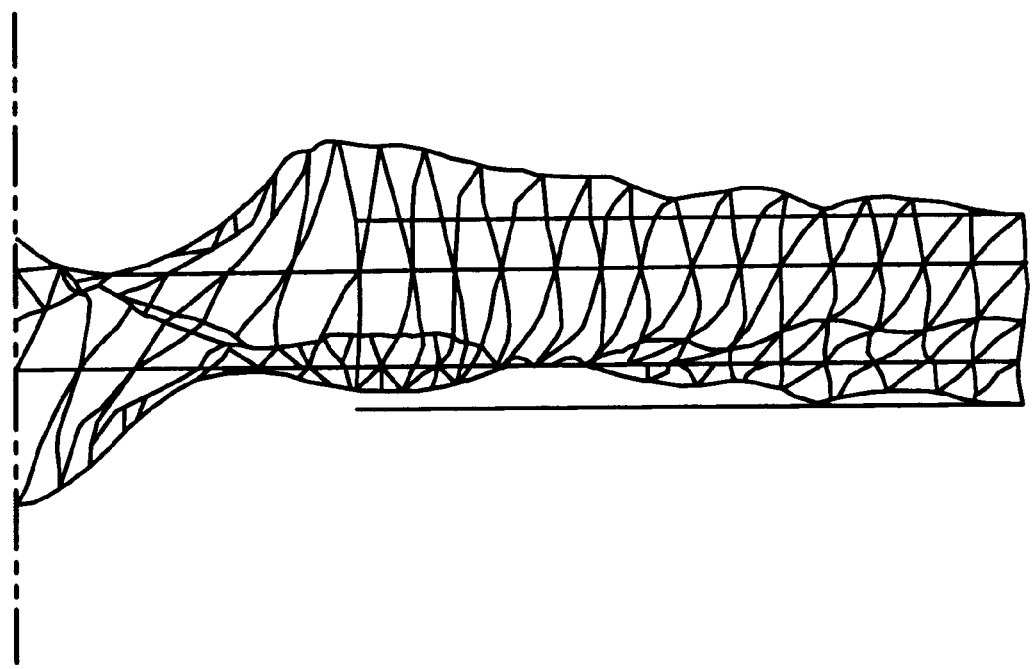
FIG. 5 is a diagram illustrating the distribution of displacements of a piezoelectric body vibrating in an inharmonic overtone (S1), the distribution being analyzed by the finite element method.

FIGS. 4 and 5 are diagrams illustrating the distributions of displacements analyzed by the finite element method when the second-order wave (TE2) of a thickness extensional vibration mode and an inharmonic overtone (S1 mode) are excited. FIGS. 4 and 5 schematically show the displacements on a half of a vertically cut surface across a strip-type thickness extensional vibration mode piezoelectric resonator 1 shown in FIG. 3, i.e., a half of a plane cut across the thickness extensional vibration mode piezoelectric resonator along the longitudinal direction and in the direction of thickness.

As can be seen from FIG. 5, the inharmonic overtone greatly displaces the piezoelectric plate in the resonating portion of the thickness extensional vibration mode piezoelectric resonator. It is observed that if such an inharmonic overtone is produced with a large amplitude, vibration of the second-order wave of the thickness extensional vibration mode shown in FIG. 4 is significantly affected.

To overcome this problem, the inventors of the present application determined that the inharmonic overtone S1 can be reduced and spurious components caused by the inharmonic overtone S1 are reduced by setting the ratio l/d to a value where l is the length of overlap between the internal electrode with the first and second excitation electrodes in the longitudinal direction of the piezoelectric plate 1, t is the thickness of the piezoelectric plate 2, and d=t/n. As a result, only the second-order wave TE2 of the thickness extensional vibration mode is excited strongly.

Figure 6:
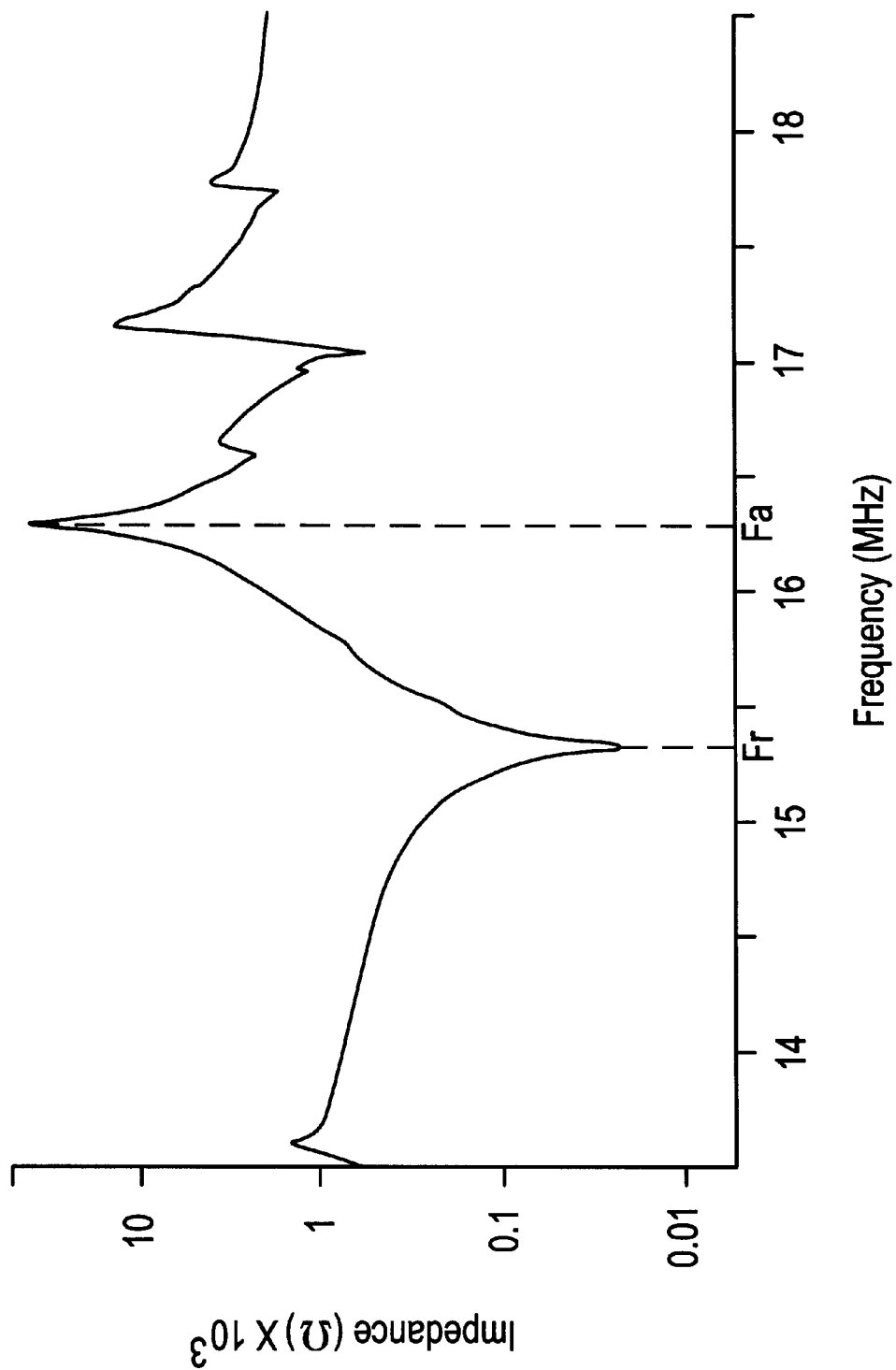
FIG. 6 is a diagram illustrating the impedance-frequency characteristic of the thickness extensional vibration mode piezoelectric resonator where a ratio l/d is about 5.0 and analysis is made by the finite element method.
Figure 7:
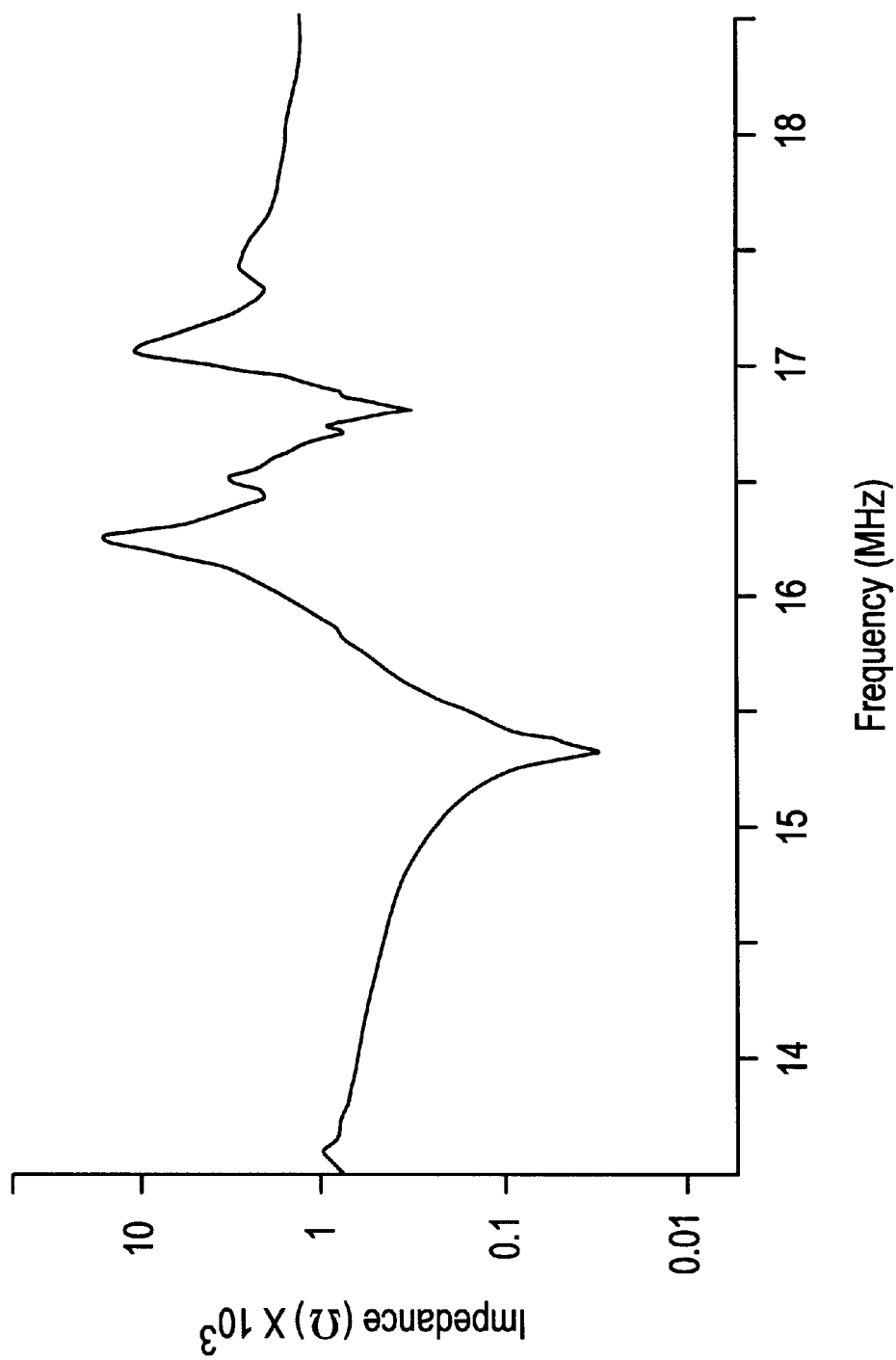
FIG. 7 is a diagram illustrating the impedance-frequency characteristic of the thickness extensional vibration mode piezoelectric resonator shown in FIG. 1, the characteristics being analyzed by the finite element method where a ratio l/d is about 3.0.

FIGS. 6 and 7 show the impedance-frequency characteristics of the piezoelectric resonator 1 where the ratio l/d is set to about 5.0 and about 3.0, respectively.

As can be seen from FIG. 6, where the ratio l/d is about 5.0, no significant spurious vibrations are produced near the passband between the resonant point Fr and the antiresonant point Fa. Therefore, the spurious components caused by the inharmonic overtones are effectively suppressed.

As will be noted from FIG. 7, where the ratio l/d is about 3.0, no waveform division takes place near the antiresonant point Fa as shown in FIG. 20. Consequently, spurious components caused by the inharmonic overtone are effectively suppressed.

Comparison of the characteristic shown in FIG. 6 with the characteristic shown in FIG. 7 shows that the response to the spurious component is more effectively suppressed in the case where the ratio l/d=5.0 than in the case where the ratio l/d=3.0.

A piezoelectric ceramic made of a lead titanate having a length L=3.0 mm, a width W=0.5 mm, and a thickness t=0.3 mm was used as the piezoelectric plate 1. The dimension l of the overlap between the first and second excitation electrodes in the longitudinal direction was changed to various values. Variations in the resonant characteristics with the ratio l/d were examined. The results are shown in FIGS. 8 and 9.

Figure 8:
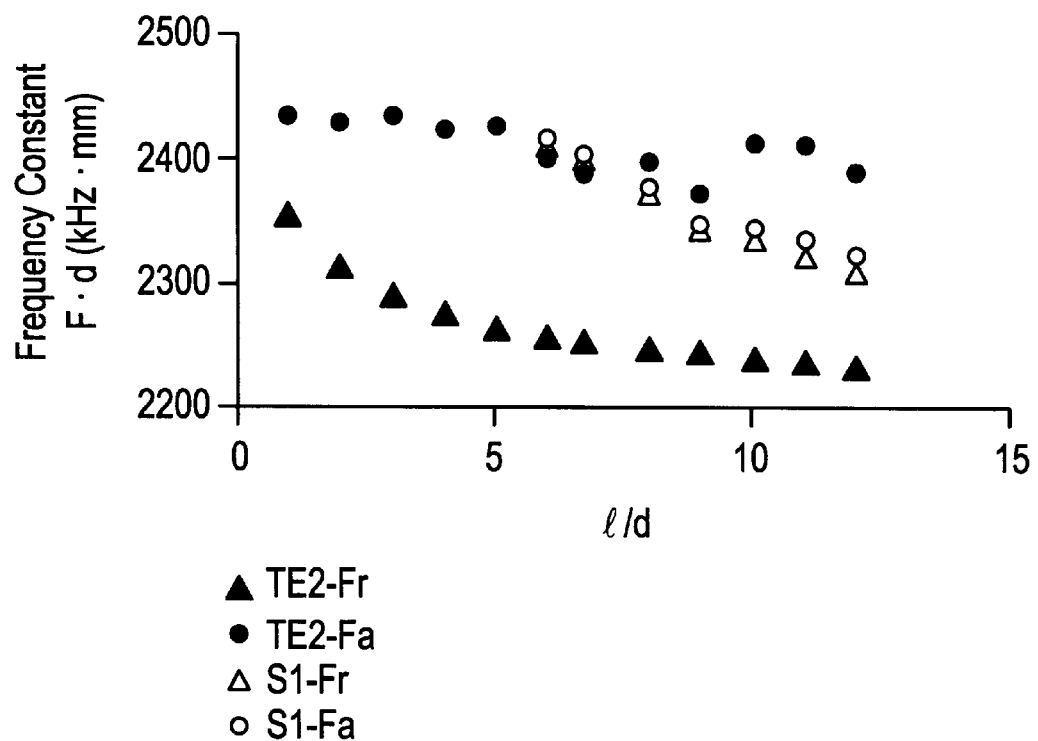
FIG. 8 is a diagram illustrating the relationships between the ratio l/d, the second-order wave TE2 of a thickness extensional vibration mode and the frequency constant of an inharmonic overtone S1.
Figure 9:
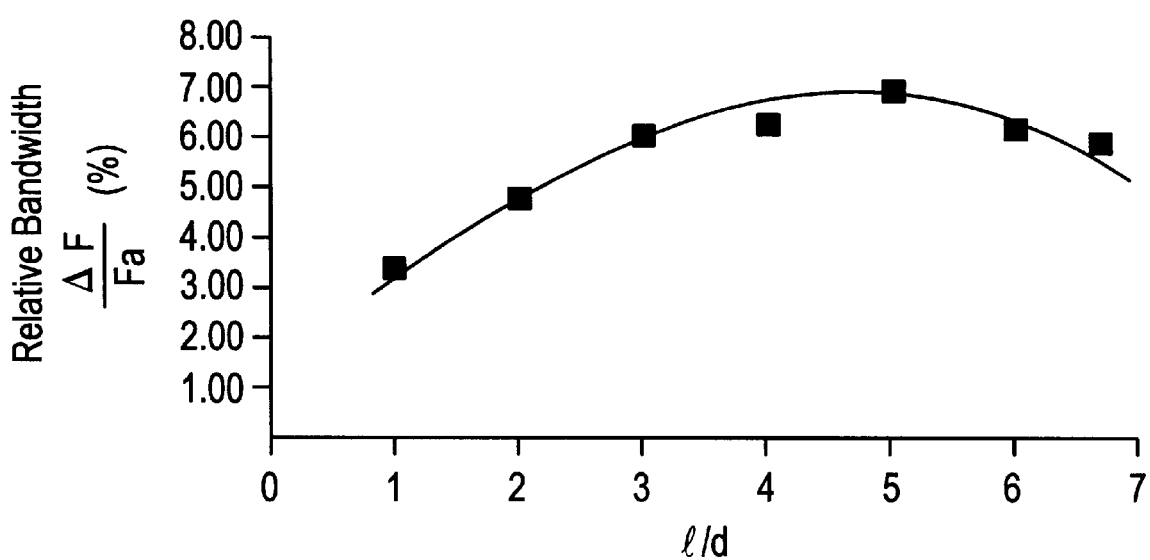
FIG. 9 is a diagram illustrating the relationship between the ratio l/d and the relative bandwidth.

FIG. 8 is a diagram illustrating the variations in the frequency constant F·d where the ratio l/d changed. The frequency constant F·d is a value expressed in terms of the product of the frequency at the resonant point Fr or antiresonant point Fa and the above-described d.

In FIG. 8, ▲ indicates the resonant point Fr of the second-order wave ($TE_2$) of a thickness extensional vibration mode, ● indicates the antiresonant point Fa of the second-order wave ($TE_2$) of the thickness extensional vibration mode, Δ indicates the antiresonant point Fr of the inharmonic overtone (S1), and ○ indicates the position of the antiresonant point Fa of the inharmonic overtone (S1).

As can be seen from FIG. 8, where l/d=6 is exceeded, the resonant point Fr and the antiresonant point Fa of the inharmonic overtone S1 appear near the antiresonant point Fa of the second-order wave TE2 of a thickness extensional vibration. Where the ratio l/d is not less than about 8, the inharmonic overtones are produced in the band between the resonant point Fr and the antiresonant point Fa of the second-order wave TE2 of the thickness extensional vibration. On the other hand, where l/d is not greater than about 6, no inharmonic overtone appears.

Where the ratio l/d is not greater than about 6, the generation of inharmonic overtones are effectively suppressed. However, as the ratio l/d decreases, the passband for the second-order wave TE2 of the thickness extensional vibration mode, i.e., the bandwidth between the resonant point Fr and the antiresonant point Fa narrows.

Examples in which the relative bandwidth was measured by the finite element method when the ratio l/d was varied were analyzed and the results of this analysis are shown in FIG. 9.

The relative bandwidth is defined by:

$$(Fa-Fr) \times 100/Fa \ (\%)$$

where Fr is a resonant frequency and Fa is an antiresonant frequency.

As can be seen from FIG. 9, as the ratio l/d is varied, the relative bandwidth changes. Where the ratio l/d is in the range of about 3 to about 6, the relative bandwidth is as large as 6% or more. Especially, in the range of about 4.5 to about 5.5, the relative bandwidth is as large as about 7%.

Therefore, spurious components caused by inharmonic overtones can be suppressed by setting the ratio l/d to between about 3 and about 6, and preferably in the range of about 4.5 to about 5.5. In addition, a large relative bandwidth and excellent resonant characteristics are achieved in the energy-trap thickness extensional vibration mode piezoelectric resonator 1.

In the thickness extensional vibration mode piezoelectric resonator 1 according to preferred embodiments of the present embodiment, the ratio l/d is not greater than about 6 as described above. Therefore, in an energy-trap piezoelectric resonator utilizing the second-order wave TE2 of a thickness extensional vibration mode, unwanted spurious components caused by inharmonic overtones are suppressed effectively.

In the thickness extensional vibration mode piezoelectric resonator 1 according to the first preferred embodiment, the piezoelectric strip 2 is polarized uniformly in the direction of thickness. The piezoelectric resonator is connected in a parallel configuration such that the applied electric field is reversed with each of the successive layers. The preferred embodiments of the present invention may also be applied to a series-connection type piezoelectric resonator in which plural piezoelectric layers are alternately polarized oppositely in the direction of thickness. A thickness extensional vibration mode piezoelectric resonator of such a series type is shown in FIG. 10.

Figure 10:
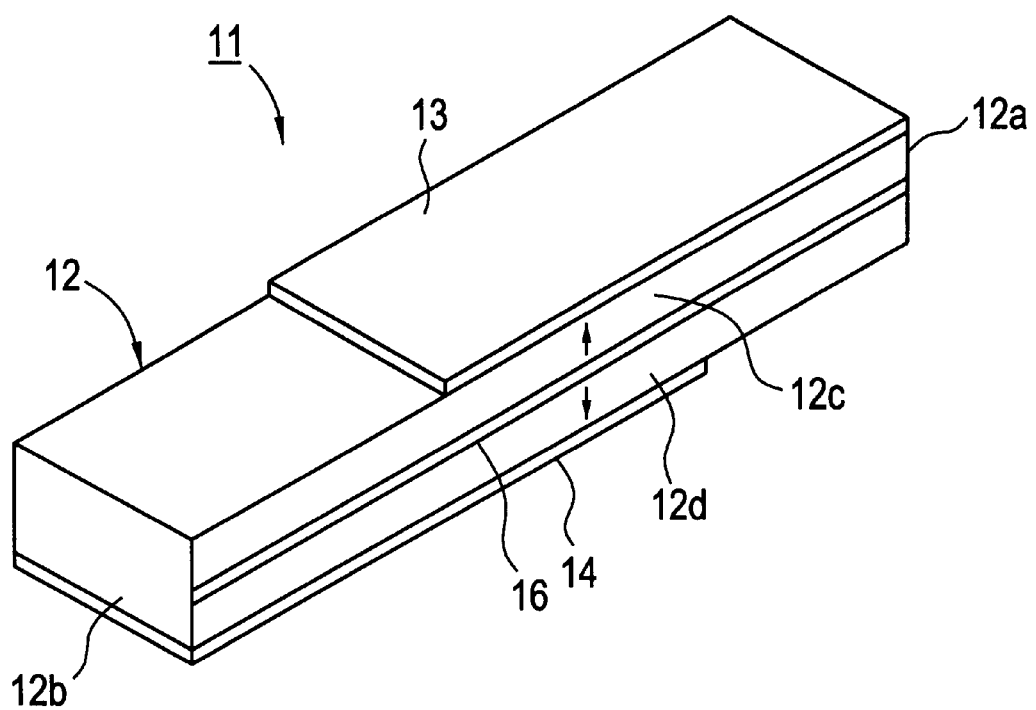
FIG. 10 is a perspective view illustrating a thickness extensional piezoelectric resonator according to a second preferred embodiment.

A thickness extensional vibration mode piezoelectric resonator 11 shown in FIG. 10 is preferably made of an elongated substantially rectangular piezoelectric strip 12. A first excitation electrode 13 is disposed on the top surface of the piezoelectric strip 12. A second excitation electrode 14 is disposed on the bottom surface. The first and second excitation electrodes 13 and 14, respectively, are located on opposite sides of the piezoelectric strip 12. The first and second excitation electrodes 13 and 14 are opposite to each other at the approximately central portion of the piezoelectric strip 12. The portion where the first and second excitation electrodes 13 and 14 are arranged opposite to each other defines an energy-trap resonator portion.

Also, in the present preferred embodiment, the first and second excitation electrodes 13 and 14 are extended to end surfaces 12a and 12b, respectively, of the piezoelectric strip 12. The portions other than the resonator portion are not required to extend along the entire length of the piezoelectric strip 12.

From a different viewpoint, the excitation electrodes 13 and 14 define an energy-trap resonator portion having vibration-attenuating portions extending only along the longitudinal direction of the piezoelectric strip 12. For this purpose, the first and second excitation electrodes 13 and 14 extend to the longitudinal sides of the piezoelectric strip 12 in a direction that is substantially perpendicular to the longitudinal direction.

An internal electrode 16 is disposed at a middle portion within the piezoelectric strip 12 and functions to polarize the piezoelectric strip 12. That is, during polarization, piezoelectric layers 12c and 12d are polarized in opposite directions in the direction of thickness as indicated by the arrows by applying a higher voltage and a lower voltage to the internal electrode 16 and the excitation electrodes 13, 14, respectively.

During operation, an AC voltage is applied between the first and second excitation electrodes 13 and 14, respectively. That is, the internal electrode 16 is not used for the operation. Upon application of the AC voltage, the second-order wave $TE_2$ of a thickness extensional vibration mode can be excited.

Also, in the thickness extensional vibration mode piezoelectric resonator 11 according to the second preferred embodiment, the ratio l/d is preferably not greater than about 6 and so the resonator can effectively suppress unwanted spurious components caused by inharmonic overtones in the same way as the thickness extensional vibration mode piezoelectric resonator 1 according to the first preferred embodiment. Also, excellent resonant characteristics are obtained.

The first and second preferred embodiments provide piezoelectric resonators 1 and 11 both utilizing the second-order wave of a thickness extensional vibration mode. Piezoelectric resonators in accordance with the preferred embodiments of the present invention may make use of harmonics other than the second-order wave of a thickness extensional vibration mode. FIGS. 11–14 are cross-sectional views illustrating piezoelectric resonators utilizing these other harmonics, and correspond to FIG. 2 used to describe the first preferred embodiment.

Figure 11:
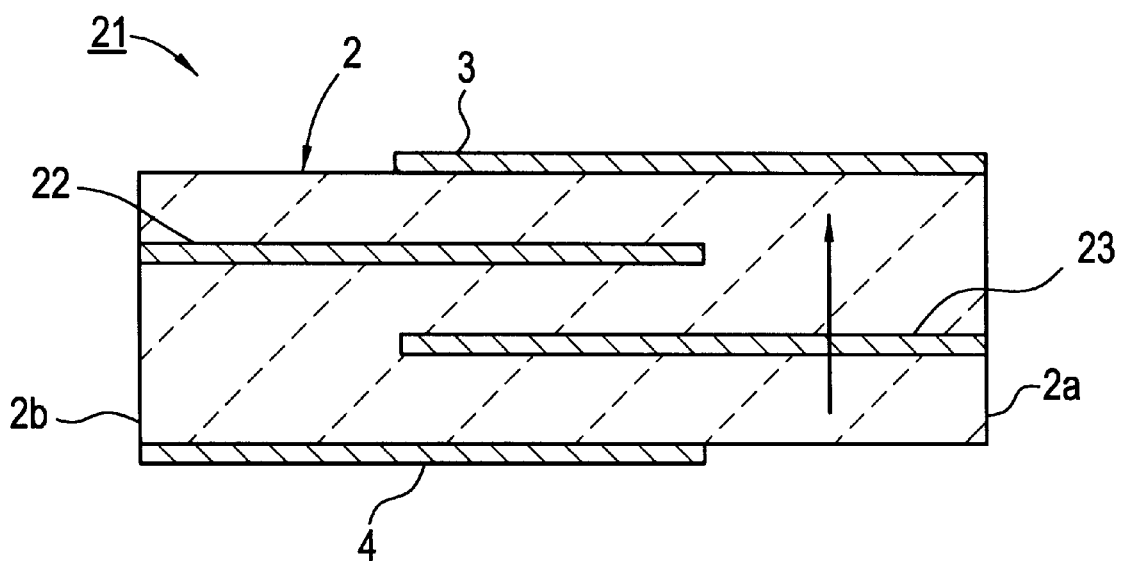
FIG. 11 is a cross-sectional view showing a first modified example of a thickness extensional piezoelectric resonator according to preferred embodiments of the present invention.

FIG. 11 is a parallel-connection type thickness extensional vibration mode piezoelectric resonator 21 utilizing the third-order wave of a thickness extensional vibration mode. In particular, two internal electrodes 22 and 23 are disposed in a piezoelectric body 2. The piezoelectric body 2 is polarized uniformly in the direction of thickness as indicated by the arrow in FIG. 11. Thus, the piezoelectric resonator 21 using the third-order wave of a thickness extensional vibration mode can be built.

Figure 12:
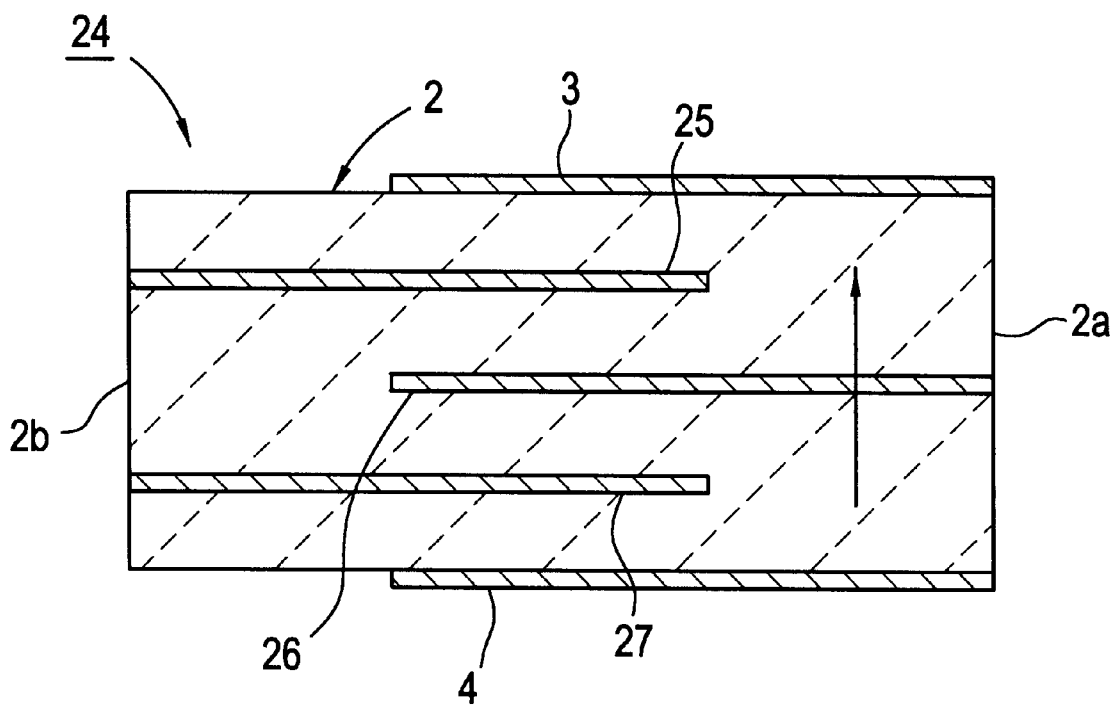
FIG. 12 is a cross-sectional view showing a second modified example of a thickness extensional piezoelectric resonator according to the preferred embodiments of the present invention.

A thickness extensional vibration mode piezoelectric resonator 24 shown in FIG. 12 is a cross-sectional view illustrating a parallel-connection type piezoelectric resonator 24 using the fourth-order wave of a thickness extensional vibration mode. In the thickness extensional vibration mode piezoelectric resonator 24, the piezoelectric strip 2 is polarized uniformly in the direction of thickness. Three internal electrodes 25–27 are regularly spaced from each other in the direction of thickness inside the resonator. Consequently, the fourth-order wave of a thickness extensional vibration mode is effectively excited.

Figure 13:
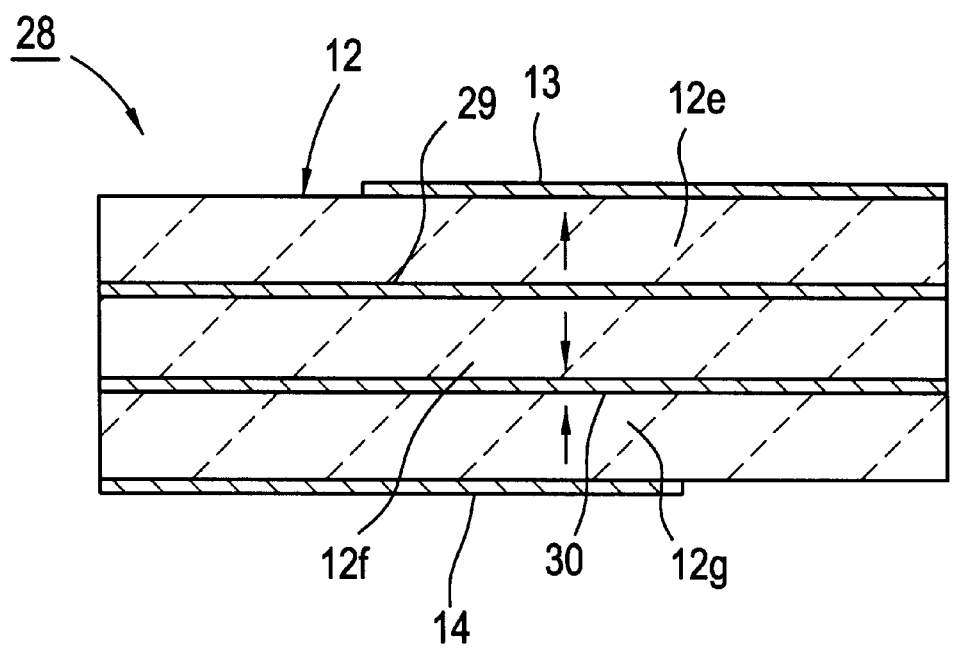
FIG. 13 is a cross-sectional view showing a third modified example of a thickness extensional piezoelectric resonator according to the preferred embodiments of the present invention.

FIG. 13 is a cross-sectional view showing a series-connection type thickness extensional vibration mode piezoelectric resonator 28 using the third-order wave of a thickness extensional vibration mode. In this thickness extensional vibration mode piezoelectric resonator 28, two internal electrodes 29 and 30 are disposed in a piezoelectric body 12. The inside of the piezoelectric body 12 is divided into three layers of piezoelectric layers 12e–12g. Polarization is performed, using these internal electrodes 29 and 30, so that piezoelectric layers adjacent to each other in the direction of thickness are polarized in opposite directions. Thus, the third-order wave of a thickness extensional vibration mode can be excited by applying an AC voltage to the first and second excitation electrodes 13 and 14.

Figure 14:
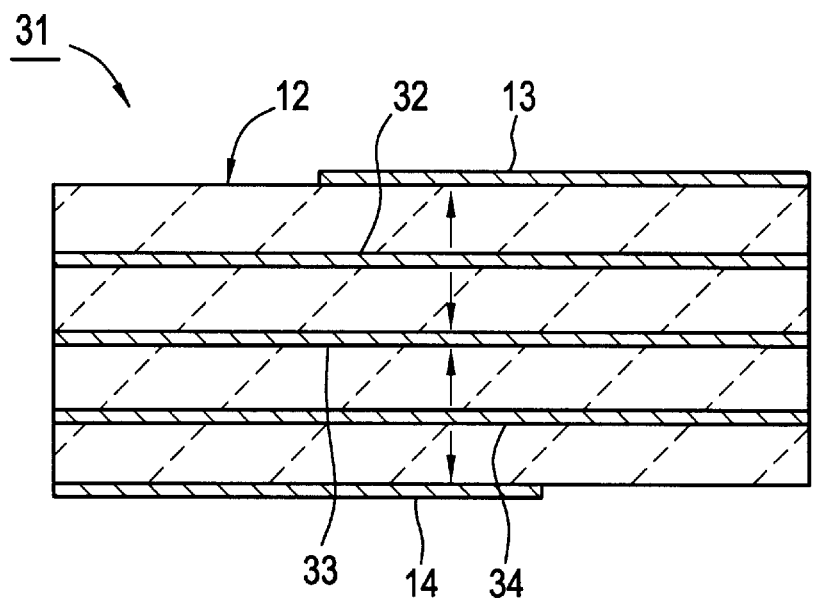
FIG. 14 is a cross-sectional view showing a fourth modified example of a thickness extensional piezoelectric resonator according to the preferred embodiments of the present invention.

Similarly, FIG. 14 is a cross-sectional view showing a series-connection type piezoelectric resonator 31 using the fourth-order wave of a thickness extensional vibration mode. Here, three internal electrodes 32–34 are disposed in a piezoelectric body 12. Polarization is carried out, using these internal electrodes 32–34, such that piezoelectric layers adjacent to each other in the direction of thickness are polarized in opposite directions.

Therefore, it can be operated as a piezoelectric resonator using the fourth-order wave of a thickness extensional vibration, by applying an AC voltage to the first and second excitation electrodes 13 and 14, respectively.

In each thickness extensional vibration mode piezoelectric resonator shown in FIGS. 11–14, the ratio l/d is preferably not greater than about 6. As a result, the resonators shown in FIGS. 11–14 effectively suppress unwanted spurious components caused by responses to inharmonic overtones by making use of a harmonic wave of a thickness extensional vibration, in the same way as the thickness extensional vibration mode piezoelectric resonators according to the first and second preferred embodiments.

Figure 15:
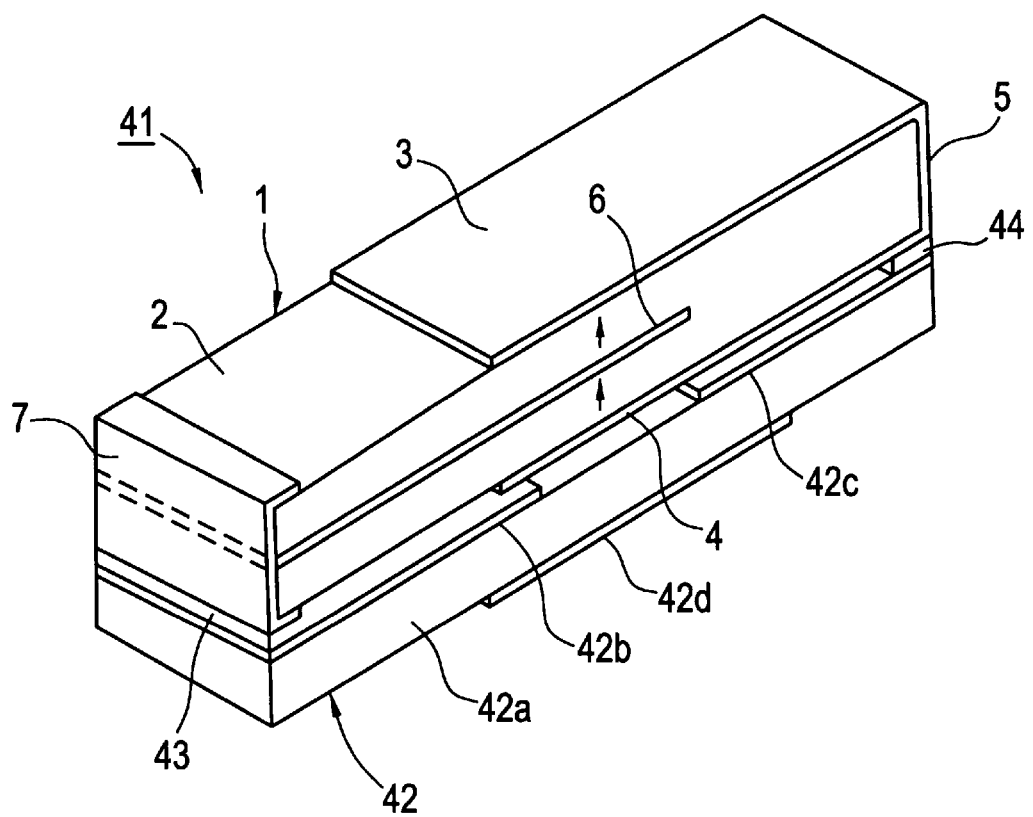
FIG. 15 is a perspective view showing a piezoelectric resonator having a built-in capacitor, the resonator being built according to the third preferred embodiment of the present invention.
Figure 16:
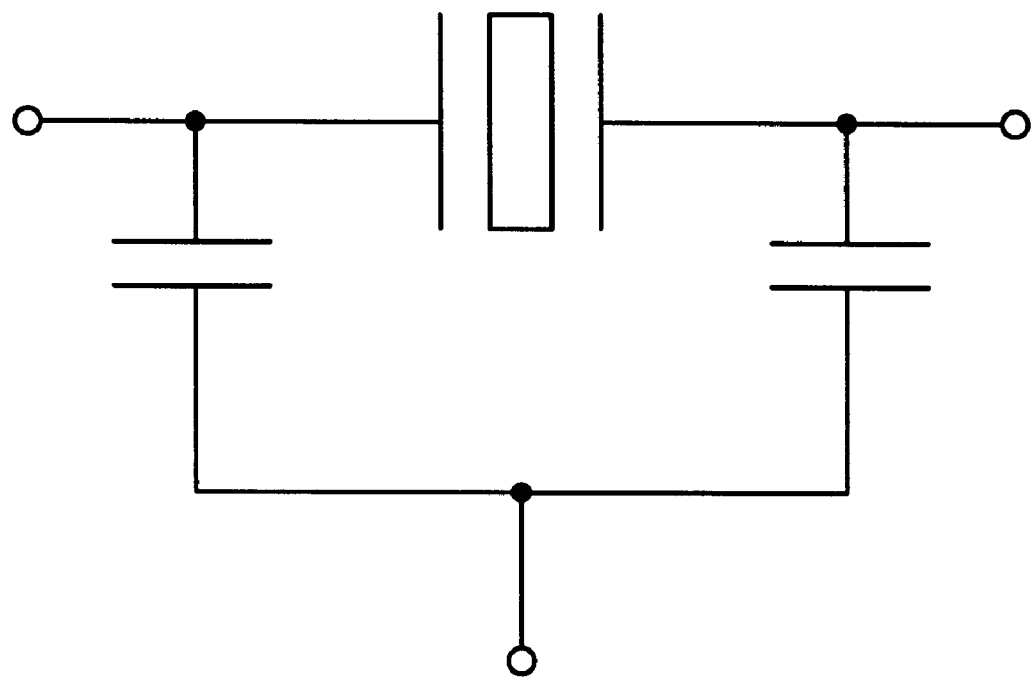
FIG. 16 is a diagram showing the circuit configuration of the piezoelectric resonator shown in FIG. 15.
Figure 17:
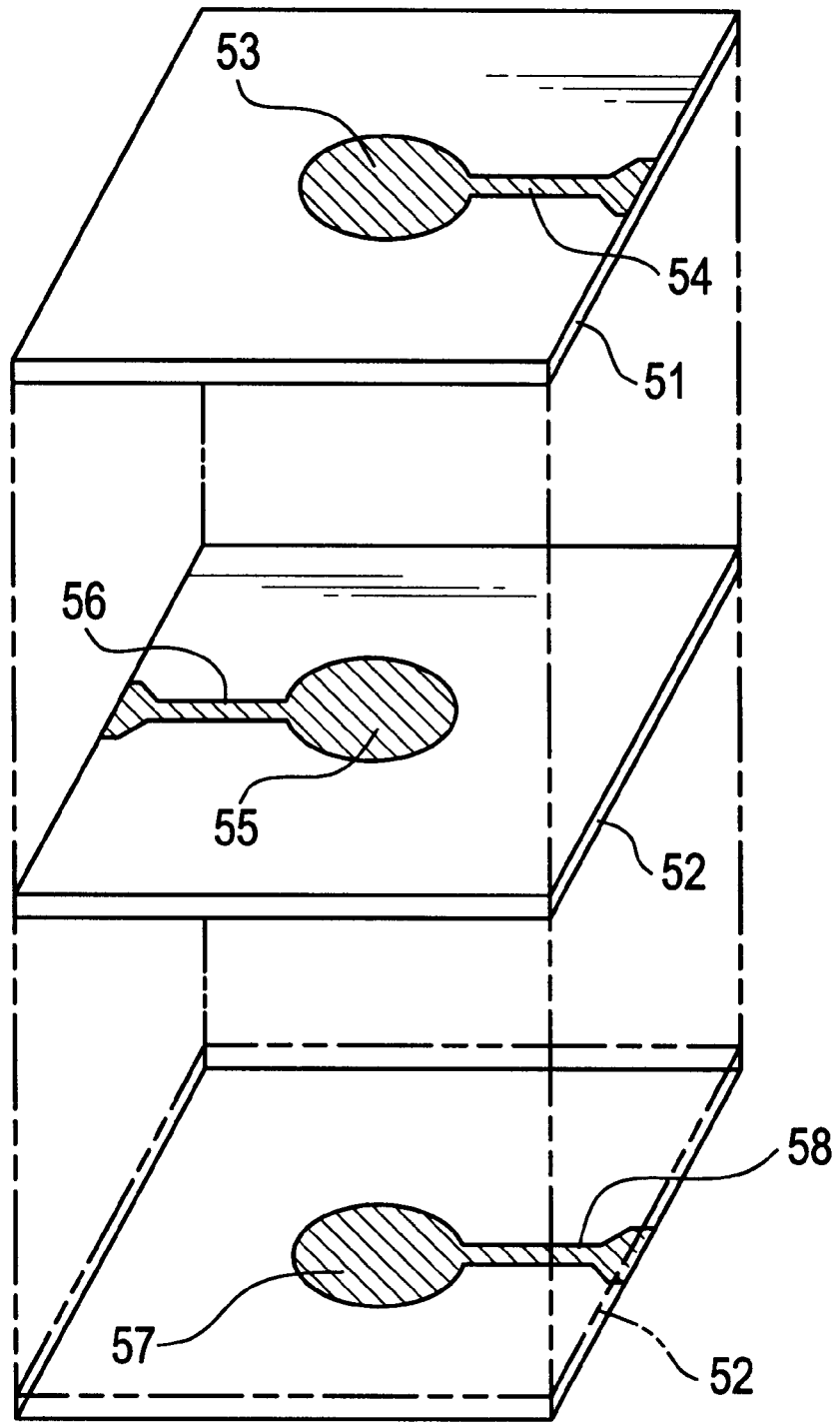
FIG. 17 is an exploded perspective view illustrating one example of the prior art thickness extensional vibration mode piezoelectric resonator.
Figure 18:
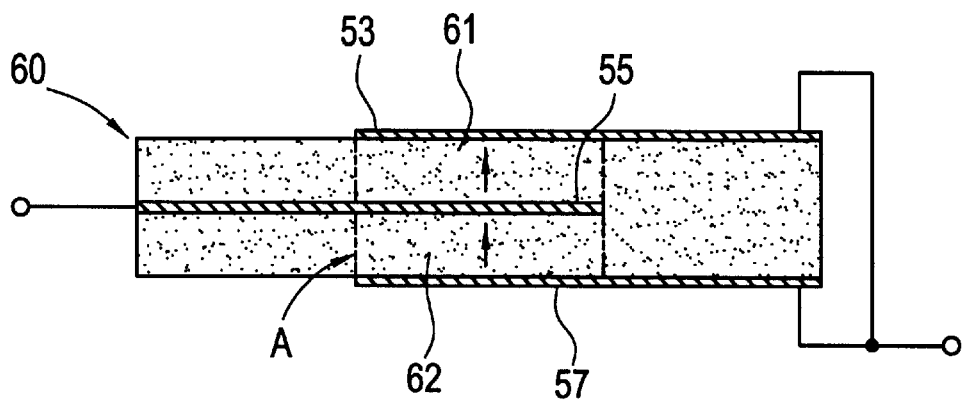
FIG. 18 is a cross-sectional view of the thickness extensional piezoelectric resonator shown in FIG. 17.

FIG. 15 is a perspective view for illustrating a thickness extensional vibration mode piezoelectric resonator according to a third preferred embodiment of the present invention. FIG. 16 is a diagram showing an equivalent circuit of the resonator of FIG. 15. FIG. 15 shows a piezoelectric resonator 41 that is a combination of the thickness extensional vibration mode piezoelectric resonator 1 according to the first preferred embodiment and a capacitor 42. This capacitor 42 is bonded to the bottom surface of the thickness extensional vibration mode piezoelectric resonator 1 via conductive adhesive 43, 44.

In the capacitor 42, capacitive electrodes 42b and 42c are located at a gap on the top surface of a dielectric substrate 42a. A common electrode 42d is disposed on the bottom surface of the dielectric substrate 42a. The common electrode 42d and the capacitive electrodes 42b, 42c are located on opposite sides of the dielectric substrate 42a.

The conductive adhesive 43 bonds the capacitive electrode 42b to a terminal electrode 7. The conductive adhesive 44 bonds the capacitive electrode 42c to a terminal electrode 5.

Therefore, as shown in FIG. 16, the piezoelectric resonator 41 can be used as a piezoelectric resonator incorporating two capacitive units.

Thus, the thickness extensional vibration mode piezoelectric resonator 1 is a piezoelectric resonator utilizing the second-order waves of thickness extensional vibrations. Spurious vibrations caused by inharmonic overtones are effectively suppressed. Therefore, piezoelectric resonators having excellent frequency characteristics are provided.

While the invention has been particularly shown and described with reference to preferred embodiments thereof, it will be understood by those skilled in the art that the forgoing and other changes in form and details may be made therein without departing from the spirit of the invention.

What is claimed is:

1. An energy-trap thickness extensional vibration mode piezoelectric resonator utilizing an nth-order harmonic of a thickness extensional vibration mode, comprising:

a piezoelectric plate having first and second surfaces arranged opposite to each other;

a first excitation electrode provided on said first surface of said piezoelectric plate;

a second excitation electrode provided on said second surface of said piezoelectric plate and arranged opposite said first excitation electrode with said piezoelectric plate disposed therebetween;

at least one internal electrode disposed in said piezoelectric plate and located at least partially opposite to the first and second excitation electrodes;

an opposing portion of said first and second excitation electrodes, said internal electrode and said piezoelectric plate defining a resonating portion, such that said first excitation electrode, said second excitation electrode and said at least one internal electrode extend across substantially the entire width of said piezoelectric plate;

vibration-attenuating portions disposed on only two sides of said resonating portion along the longitudinal direction of the piezoelectric plate;

said first and second excitation electrodes extending substantially to both sides of the piezoelectric plate in a direction that is substantially perpendicular to said one direction in which said vibration-attenuating portions extend; and said first and second excitation electrodes overlapped with said internal electrode only at a central portion of said piezoelectric plate and over a length of l such that l/d≦6 in which d=t/n, where t is a thickness of said piezoelectric plate and n is an integral larger than 1.

2. The energy-trap thickness extensional vibration mode piezoelectric resonator according to claim 1, wherein said ratio l/d is in a range of about 3 to about 6.

3. The energy-trap thickness extensional vibration mode piezoelectric resonator according to claim 1, wherein said piezoelectric plate has an elongated piezoelectric strip shape.

4. The energy-trap thickness extensional vibration mode piezoelectric resonator according to claim 1, wherein said piezoelectric plate has a substantially rectangular shape.

5. The energy-trap thickness extensional vibration mode piezoelectric resonator according to claim 1, further comprising a capacitor disposed on said first and second surfaces of said piezoelectric plate with a space defined therebetween to allow free and unimpeded vibrations of the piezoelectric resonator.

6. The energy-trap thickness extensional vibration mode piezoelectric resonator according to claim 1, wherein said nth-order harmonic of said thickness extensional vibration mode used in said resonator is a second order wave of said thickness extensional vibration mode.

7. The energy-trap thickness extensional vibration mode piezoelectric resonator of claim 1, wherein said nth-order harmonic of said thickness extensional vibration mode used in said resonator is a third order wave of said thickness extensional vibration mode.

8. The energy-trap thickness extensional vibration mode piezoelectric resonator of claim 1, wherein said nth-order harmonic of said thickness extensional vibration mode used in said resonator is a fourth order wave of said thickness extensional vibration mode.

9. The energy-trap thickness extensional vibration mode piezoelectric resonator of claim 1, wherein said piezoelectric strip is polarized uniformly in a direction of thickness thereof.

10. The energy-trap thickness extensional vibration mode piezoelectric resonator of claim 1, wherein said piezoelectric strip includes a plurality of piezoelectric layers each having a reverse electric field compared to an electric field of an adjacent one of the piezoelectric layers.

11. The energy-trap thickness extensional vibration mode piezoelectric resonator of claim 1, wherein said piezoelectric strip includes portions which are alternately polarized oppositely in a direction of thickness thereof.

12. An energy-trap piezoelectric resonator comprising:

a piezoelectric plate having first and second surfaces arranged opposite to each other;

a first excitation electrode provided on said first surface of said piezoelectric plate;

a second excitation electrode provided on said second surface of said piezoelectric plate and arrange to oppose said first excitation electrode with said piezoelectric pate disposed therebetween;

at least one internal electrode disposed in said piezoelectric pate and located at least partially opposite to the first and second excitation electrodes; wherein an opposing portion of said first and second excitation electrodes, said internal electrode and said piezoelectric plate defining a resonating portion, such that said first excitation electrode, said second excitation electrode and said at least one internal electrode extend across substantially the entire width of said piezoelectric plate;

said first and second excitation electrodes overlapped with said internal electrode only at a central portion of said piezoelectric plate and over a length of l such that l/d≦6 in which d=t/n, where t is a thickness of said piezoelectric plate and n is an integral larger than 1; and vibration-attenuating portions disposed on only two sides of said resonating portion along longitudinal direction of the piezoelectric plate.

13. The energy-trap piezoelectric resonator according to claim 12, wherein said first and second excitation electrodes extend substantially to both sides of the piezoelectric plate in a direction that is substantially perpendicular to said one direction in which said vibration-attenuating portions extend.

14. The energy-trap piezoelectric resonator according to claim 12, wherein said ratio l/d is in a range of about 3 to about 6.

15. The energy-trap piezoelectric resonator according to claim 12, wherein said piezoelectric plate has an elongated piezoelectric strip shape.

16. The energy-trap piezoelectric resonator according to claim 12, wherein said piezoelectric plate has a substantially rectangular shape.

17. The energy-trap piezoelectric resonator according to claim 12, further comprising a capacitor disposed on said first and second surfaces of said piezoelectric plate with a space defined therebetween to allow free and unimpeded vibrations of the piezoelectric resonator.

18. The energy-trap piezoelectric resonator according to claim 12, wherein said piezoelectric strip is polarized uniformly in a direction of thickness thereof.

19. The energy-trap piezoelectric resonator of claim 12, wherein said piezoelectric strip includes a plurality of piezoelectric layers each having a reverse electric field compared to an electric field of an adjacent one of the piezoelectric layers.

* * * * *